(12) United States Patent
Schmidt et al.

(10) Patent No.: US 8,680,547 B2
(45) Date of Patent: Mar. 25, 2014

(54) LIGHT EMITTING DEVICE COMPRISING A MULTIPHASE CERAMIC MATERIAL

(75) Inventors: Peter J. Schmidt, Aachen (DE); Baby-Seriyati Schreinemacher, Eynatten (BE); Andreas Tuecks, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 744 days.

(21) Appl. No.: 12/682,258

(22) PCT Filed: Sep. 25, 2008

(86) PCT No.: PCT/IB2008/053899
§ 371 (c)(1),
(2), (4) Date: Apr. 9, 2010

(87) PCT Pub. No.: WO2009/050611
PCT Pub. Date: Apr. 23, 2009

(65) Prior Publication Data
US 2010/0208449 A1 Aug. 19, 2010

(30) Foreign Application Priority Data
Oct. 15, 2007 (EP) .................................... 07118505

(51) Int. Cl.
*H01L 33/00* (2010.01)
(52) U.S. Cl.
USPC .................................... 257/98; 257/E33.061
(58) Field of Classification Search
None
See application file for complete search history.

(56) References Cited

U.S. PATENT DOCUMENTS

| 5,789,347 A | * | 8/1998 | Button et al. ................. 505/450 |
| 2006/0124947 A1 | | 6/2006 | Mueller et al. |
| 2007/0080326 A1 | | 4/2007 | Fiedler et al. |
| 2007/0126017 A1 | | 6/2007 | Krames et al. |

FOREIGN PATENT DOCUMENTS

| EP | 1669429 A2 | 6/2006 |
| JP | 2004238505 | 8/2004 |
| JP | 2005336450 A | 12/2005 |
| JP | 2006089547 A | 4/2006 |
| JP | 2006169526 A | 6/2006 |
| JP | 2008189811 A | 8/2008 |
| WO | 2005103199 A1 | 11/2005 |
| WO | 2006006099 A1 | 1/2006 |
| WO | 2006072918 A1 | 7/2006 |
| WO | 2006073141 A1 | 7/2006 |
| WO | 2006087660 A1 | 8/2006 |
| WO | 2006098700 A1 | 9/2006 |
| WO | 2006111906 A2 | 10/2006 |
| WO | WO 2006/111906 A2 * | 10/2006 |
| WO | 2006126567 A1 | 11/2006 |
| WO | 2007105631 A1 | 9/2007 |

* cited by examiner

*Primary Examiner* — Michael Lebentritt
*Assistant Examiner* — Kevin Quinto

(57) ABSTRACT

The invention relates to a light emitting device comprising a light source, especially a LED, and a luminescent material, which is a ceramic multiphase material essentially of the composition $M_{2-z}Ce_zSi_{5-x-y-(z-z1)}A_{y+(z-z1)}N_{8-4x-y+z1}O_{4x+y-z1}$. This material has been found to have a composition of at least two phases, which leads to a better producibility as well as photostability and conversion efficiency.

14 Claims, 3 Drawing Sheets

LIGHT EMITTING DEVICE COMPRISING A MULTIPHASE CERAMIC MATERIAL

FIELD OF THE INVENTION

The present invention is directed to light emitting devices, especially to the field of LEDs

BACKGROUND OF THE INVENTION

A phosphor material (or a phosphor) is used as a wavelength converter (or a phosphor converter=pc), which absorbs a first wavelength emitted from a light source and re-emits a second wavelength longer than the first wavelength (luminescent material). Phosphors comprising silicates, phosphates (for example, apatite) and aluminates as host materials, with transition metals or rare earth metals added as activating materials to the host materials, are widely known. As blue LED light sources, in particular, have become practical in recent years, the development of white light sources utilizing such blue LEDs in combination with such phosphor materials is being energetically pursued.

Especially luminescent materials based on the so-called "SiAlON"-system have found the focus of attention in the field due to their good optical features.

However, there is still the continuing need for luminescent materials which are usable within a wide range of applications and especially allow the fabrication of phosphor warm white pcLEDs with optimized luminous efficiency and color rendering.

SUMMARY OF THE INVENTION

It is an object of the present invention to provide a light emitting device with a luminescent material which has improved optical features together with a good producibility.

This object is solved by a light emitting device according to claim 1 of the present invention. Accordingly, a light emitting device comprising a light source, especially a LED, and luminescent material, which is a ceramic multiphase material essentially of the composition

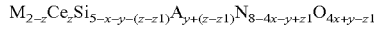

$$M_{2-z}Ce_zSi_{5-x-y-(z-z1)}A_{y+(z-z1)}N_{8-4x-y+z1}O_{4x+y-z1}$$

whereby M is selected out of the group comprising Sr, Ca, Ba, Mg, Eu or mixtures thereof, A is selected out of the group comprising Al, B, Ga or mixtures thereof and x is $\geq 0$ to $\leq 0.5$, y is $\geq 0$ to $\leq 4$, z is $\geq 0$ to $\leq 1$ and $z_1$ is $\geq 0$ to $\leq z$.

The term "multiphase" especially means and/or includes that the material comprises out of at least two different cristallographically distinguishable phases which form an overall composition as described. These phases may be of different composition, but this is not needed within the present invention.

The term "essentially" means especially that $\geq 95\%$, preferably $\geq 97\%$ and most preferred $\geq 99\%$ of the material has the desired composition.

The term "ceramic material" in the sense of the present invention means and/or includes especially a crystalline or polycrystalline compact material or composite material with a controlled amount of pores or which is pore free.

The term "polycrystalline material" in the sense of the present invention means and/or includes especially a material with a volume density larger than 90 percent of the main constituent, consisting of more than 80 percent of single crystal domains, with each domain being larger than 0.5 μm in diameter and may have different crystallographic orientations. The single crystal domains may be connected by amorphous or glassy material or by additional crystalline constituents.

Such a material has shown for a wide range of applications within the present invention to have at least one of the following advantages:

The quantum efficiency of the material is often greatly improved in contrast to many "single-phase" materials of the prior art The material usually employ a very good conversion efficiency The material has usually a very high thermal, especially photothermal stability.

An increase of x in the starting composition is believed to increase the amount of second phases in the multiphase ceramic after sintering which may increase light scattering of the luminescent ceramic. However, by proper adjustment of the x value (as described above) of the nominal composition $M_{2-z}Ce_zSi_{5-x-y-(z-z1)}A_{y+(z-z1)}N_{8-4x-y+z1}O_{4x+y-z1}$ ceramics that show both a high density because of the fluxing action of the oxygen-rich phases and a high optical transmission may be reached. According to a preferred embodiment, x is $\geq 0.0005$ and $\leq 0.25$, preferably $\geq 0.005$ and $\leq 0.1$.

Furthermore it is believed that with an increased content of A in the inventive material, the content of second phase is usually reduced and also the solubility of O in the material is increased. In case that A comprises boron or aluminum, it is also often found that grain growth of the phases (as described later on) may be increased. According to a preferred embodiment, y+(z−z1) is $\geq 0.01$ and $\leq 0.8$, preferably $\geq 0.04$ and $\geq 0.5$.

The inventors have also found that with an increasing Ba content, the activator (Eu and/or Ce) emission is often shifted towards shorter wavelengths, whereas Ca and/or Sr may lead to a shift towards longer wavelengths. Preferably, the Ba-content (in % of the number of "M"-atoms) is $\geq 30\%$, preferably $\geq 50\%$ According to a preferred embodiment, the inventive material comprises Eu. If Eu is present, it is especially preferred that its content (in % of the number of "M"-atoms) is $\geq 0.05\%$ and $\leq 5\%$, preferably $\geq 0.3\%$ and $\leq 2.5\%$.

However, if the inventive material comprises Eu and Ce, it is especially preferred that the added concentration (in mol-% of the whole material) of Eu and Ce is $\leq 3\%$, preferably $\leq 0.2\%$.

According to a preferred embodiment of the present invention, the multiphase material comprises at least one phase of the composition $M_{2-z}Ce_zSi_{5-a-(z-z1)}A_{a+(z-z1)}N_{8-a+z1}O_{a-z1}$, with M, A, z and $z_1$ as defined above and a from $\geq 0$ to $\leq 4$.

This has been shown to be advantageous for many applications within the present invention. More specifically, preferably the multiphase material comprises at least one phase of the composition $Ba_bM^I_{2-b-z}Ce_zSi_{5-a-(z-z1)}A_{a+(z-z1)}N_{8-a+z1}O_{a-z1}$, with $M^I$ selected out of the group comprising Sr, Ca, Mg, Eu or mixtures thereof and A, z and z1 as defined above and a from $\geq 0$ to $\leq 4$ and b from $\geq 0$ to $\leq 1$.

Preferably, the volume content of the $M_{2-z}Ce_zSi_{5-a-(z-z1)}A_{a+(z-z1)}N_{8-a+z1}O_{a-z1}$ and/or $Ba_bM^I_{2-b-z}Ce_zSi_{5-a-(z-z1)}A_{a+(z-z1)}N_{8-a+z1}O_{a-z1}$ phase in the material is $\geq 70\%$, preferably $\geq 80\%$ and most preferred $\geq 90\%$.

According to a preferred embodiment of the present invention, the multiphase material comprises at least one phase of the composition $MSi_7N_{10}$ with M as defined above.

This has been shown to be advantageous for many application within the present invention, especially since it has been found that usually if this phase is present within the inventive material, the feasibility of the material is greatly easened (as will be described later on).

Preferably the volume content of the $MSi_7N_{10}$ phase is ≤15%, preferably ≤10% and most preferred ≤5%.

According to a preferred embodiment of the present invention, the multiphase material comprises at least one phase of the composition $M_2SiO_4$ with M as defined above.

This has been shown to be advantageous for many application within the present invention, especially since it has been found that usually if this phase is present within the inventive material, the feasibility of the material is greatly eased (as will be described later on).

Preferably the volume content of the $M_2SiO_4$ phase is ≤15%, preferably ≤10% and most preferred ≤5%.

According to a preferred embodiment of the present invention, at least one of the phase(s) of the present invention is essentially present in the multiphase material in form of grains.

According to a preferred embodiment of the present invention, the $d_{50}$ of at least a part of the grains is ≥0.5 µm to ≤4 µm. By doing so, for many applications, the lighting features as well as the stability of the inventive multiphase ceramic can be improved.

The term "$d_{50}$" in the sense of the present invention is a measure for the average particle size and is defined as follows: the size of 50% of the number of particles (e.g. grains) in the corresponding sample is equal or smaller than the given $d_{50}$ value.

According to an additional and/or preferred embodiment of the present invention, the $d_{50}$ of at least a part of the grains is ≥5 µm to ≤30 µm. By doing so, for many applications, the lighting features as well as the stability of the inventive multiphase ceramic can be improved.

It is noted that according to the above, it is preferred that either the grain size is "rather low" or "rather high". Therefore it is clear that also a mixture of grains is a preferred embodiment of the present invention, if some of the grains are "small" (i.e. having a $d_{50}$ of 0.5 to 4 µm) and some are "big" (i.e. having a $d_{50}$ from 5 to 30 µm).

According to a preferred embodiment of the present invention, the photothermal stability of the ceramic multiphase material is ≥95% to ≤100% after exposure of the ceramic material for 10 hrs at 260° C. with a light power density of 10 W/cm$^2$ and an average photon energy of 2.75 eV.

The term "photothermal stability" in the sense of the present invention especially means and/or includes the conservation of the luminescence intensity under simultaneous application of heat and high intensity excitation, i.e. a photothermal stability of 100% indicates that the material is virtually unaffected by the simultaneous irradiation and heat up. The term unaffected especially denotes that the intensity of the emitted light remains constant.

According to a preferred embodiment of the present invention, the photothermal stability of the ceramic multiphase material is ≥85% to ≤97%, preferably ≥95% to ≤99%, after exposure of the ceramic material for 10 hrs at 260° C. with a light power density of 10 W/cm$^2$ and an average photon energy of 2.75 eV.

According to a preferred embodiment of the present invention, the thermal conductivity of the ceramic multiphase material is ≥0.07 W cm$^{-1}$ K$^{-1}$ to ≤0.3 W cm$^{-1}$ K$^{-1}$ According to one embodiment of the present invention, the ceramic multiphase material shows a transparency for normal incidence in air of ≥10% to ≤85% for light in the wavelength range from ≥550 nm to ≤1000 nm.

Preferably, the transparency for normal incidence is in air of ≥20% to ≤80% for light in the wavelength range from ≥550 nm to ≤1000 nm, more preferred ≥30% to ≤75% and most preferred >40% to <70% for a light in the wavelength range from ≥550 nm to ≤1000 nm.

The term "transparency" in the sense of the present invention means especially that ≥10% preferably ≥20%, more preferred ≥30%, most preferred ≥40% and ≤85% of the incident light of a wavelength, which cannot be absorbed by the material, is transmitted through the sample for normal incidence in air (at an arbitrary angle). This wavelength is preferably in the range of ≥550 nm and ≤1000 nm.

According to a preferred embodiment of the present invention, the ceramic multiphase material has a density of ≥95% and ≤101% of the theoretical density. In this context, all relative densities of multiphase ceramics especially refer to the theoretical density of the preferred main component of general composition $M_{2-z}Ce_zSi_{5-a-(z-z1)}A_{a+(z-z1)}N_{8-a+z1}O_{a-z1}$ and/or $Ba_bM^I{}_{2-b-z}Ce_zSi_{5-a-(z-z1)}A_{a+(z-z1)}N_{8-a+z1}O_{a-z1}$.

According to a preferred embodiment of the present invention, the ceramic multiphase material has a density of ≥97% and ≤100% of the theoretical density.

The densities lower than 100% according to the described preferred embodiment of the present invention are preferably obtained by sintering of the ceramic to a stage where still pores are present in the ceramic matrix. Most preferred are densities in the range ≥98.0% and ≤99.8% with total pore volumes in the ceramic matrix within the ≥0.2-≤2% range. A preferred mean pore diameter is in the ≥400-≤1500 nm range.

The present invention furthermore relates to a method of producing a ceramic multiphase material for a light emitting device according to the present invention out of at least two precursor materials, which comprise a $M_2Si_{5-y}A_yN_{8-y}O_y$—material and a silicon-precursor-material The term "silicon-precursor-material" especially means or includes a material which includes a silicate or substituted silicate. Especially preferred are silicates and/or oxo-nitrido-silicates. Most preferred are $MSi_2O_2N_2$ and/or $M_2SiO_4$.

Preferably the method includes a low-temperature pressing step, preferably at a temperature <100° C., most preferred at ambient temperature.

Surprisingly it has been found that a material according to the present invention may be produced without high-temperature pressing steps.

The term "pressing step" especially means and/or includes that a mixture containing the precursor materials (and—if necessary—further adjuvants or supplementary materials) is subjected to a pressure of >50 bar for at least >30 minutes.

According to a further embodiment of the present invention, the method comprises a sintering step, which is preferably performed after the pressing step.

The term "sintering step" in the sense of the present invention means especially densification of a precursor powder under the influence of heat, which may be combined with the application of uniaxial or isostatic pressure, without reaching the liquid state of the main constituents of the sintered material.

According to a preferred embodiment of the present invention, the sintering step is pressureless, preferably in reducing or inert atmosphere.

According to a preferred embodiment of the present invention, the method furthermore comprises the step of pressing the ceramic precursor material to ≥50% to ≤70%, preferably ≥55% to ≤65%, of its theoretical density of the corresponding single crystal phase which is the main constituent of the material before sintering. It has been shown in practice that this improves the sintering steps for most ceramic multiphase materials as described with the present invention.

According to a preferred embodiment of the present invention, the method of producing a ceramic multiphase material for a light emitting device according to the present invention comprises the following steps:

(a) Mixing the precursor materials for the ceramic multiphase material (b) optional firing of the precursor materials, preferably at a temperature of $\geq 1300°$ C. to $\leq 1700°$ C. to remove volatile materials (such as $CO_2$ in case carbonates are used)

(c) optional grinding and washing (d) a first pressing step, preferably a uniaxial pressing step using a suitable powder compacting tool with a mould in the desired shape (e.g. rod- or pellet-shape) and/or a cold isostatic pressing step preferably at $\geq 3000$ bar to $\leq 5000$ bar.

(e) a sintering step at $\geq 1500°$ C. to $\leq 2200°$ C. in an inert, reducing or slightly oxidizing atmosphere with a pressure of $10^{-7}$ mbar to $\leq 10^4$ mbar.

(f) optionally a post annealing step at $>1000°$ C. to $<1700°$ C. in inert atmosphere or in an hydrogen containing atmosphere.

According to this method, for most desired material compositions this production method has produced the best ceramic multiphase material s as used in the present invention.

A light emitting device according to the present invention as well as a ceramic multiphase material as produced with the present method may be of use in a broad variety of systems and/or applications, amongst them one or more of the following:

Office lighting systems
household application systems
shop lighting systems,
home lighting systems,
accent lighting systems,
spot lighting systems,
theater lighting systems,
fiber-optics application systems,
projection systems,
self-lit display systems,
pixelated display systems,
segmented display systems,
warning sign systems,
medical lighting application systems,
indicator sign systems, and
decorative lighting systems
portable systems
automotive applications
green house lighting systems The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

BRIEF DESCRIPTION OF THE DRAWINGS

Additional details, features, characteristics and advantages of the object of the invention are disclosed in the subclaims, the figures and the following description of the respective figures and examples, which—in an exemplary fashion—show several embodiments and examples of a ceramic multiphase material for use in a light emitting device according to the invention.

EXAMPLES I AND II

The invention will be better understood together with the Examples I and II which—in a mere illustrative fashion—are two Examples of inventive ceramic multiphase materials.

Example I refers to $Ba_{1.454}Sr_{0.536}Eu_{0.01}Si_{4.967}N_{7.868}O_{0.132}$, which was made the following way:

First two precursor materials (a) and (b) were produced:

(a) Preparation of $Ba_{1.5}Sr_{0.49}Eu_{0.01}Si_5N_8$ powder $(Ba_{0.75}Sr_{0.245}Eu_{0.005})_2Si_5N_8$ powder is prepared according to the reaction $1.5\ BaH_2 + 0.49\ SrH_2 + 5\ SiN_{4/3} + 0.005\ Eu_2O_3 + 2/3\ N_2 \rightarrow Ba_{1.5}Sr_{0.49}Eu_{0.01}Si_5N_8 + 0.015 H_2O + 1.975 H_2$ All precursor powders are mixed in a dry atmosphere by ball milling, followed by firing at 1450° C. in a forming gas atmosphere. After firing, the powder is milled and washed with hydrochloric acid and dried: Powder A (b) Preparation of $SrSi_2O_2N_2$ $SrSi_2O_2N_2$ is prepared according the reaction $SrO + 0.5\ SiO_2 + 3/2\ SiN_{4/3} \rightarrow SrSi_2O_2N_2$ All precursor powders are mixed in a dry atmosphere by ball milling, followed by firing at 1300° C. in a nitrogen gas atmosphere: Powder B (c) Ceramic processing 95 wt % powder A is mixed with 5 wt % of powder B by ball milling in dry alcohol. After addition of a polyvinylbutyral binder and granulation, the mixture is compacted by cold isostatic pressing to obtain green ceramic disks. The disks are debindered in nitrogen atmosphere at 600° C. and fired at 1650° C. under a nitrogen atmosphere for 4-8 hours.

Result: Dense composite ceramics with 4.32 g/cm³ density (relative density of 97.3% compared to the theoretical density of a phase pure $(Ba_{0.75}Sr_{0.25})_2Si_5N_8$ ceramic).

Figure 1:
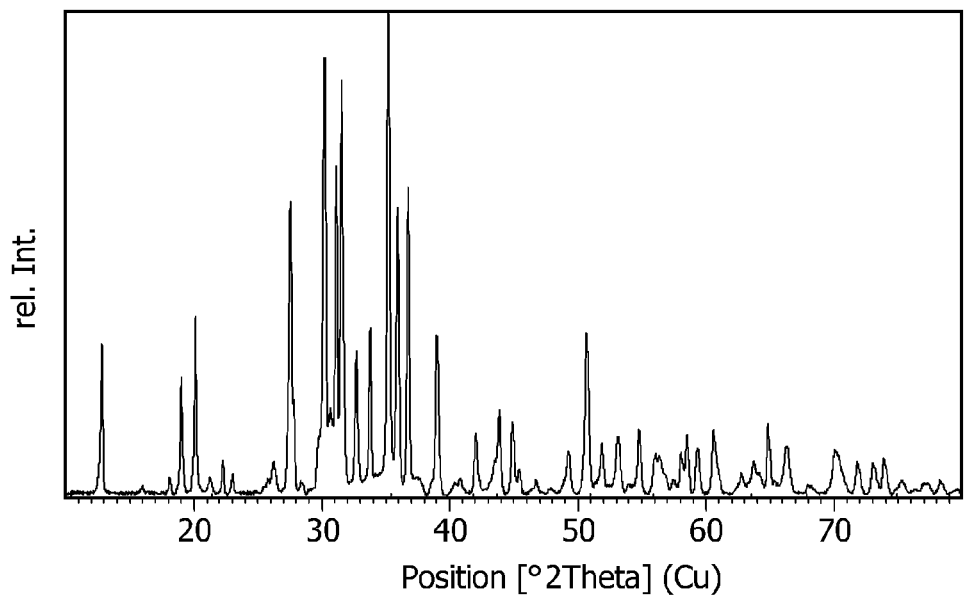
FIG. 1 shows an XRD pattern for a material according to Example I of the present invention
Figure 2:
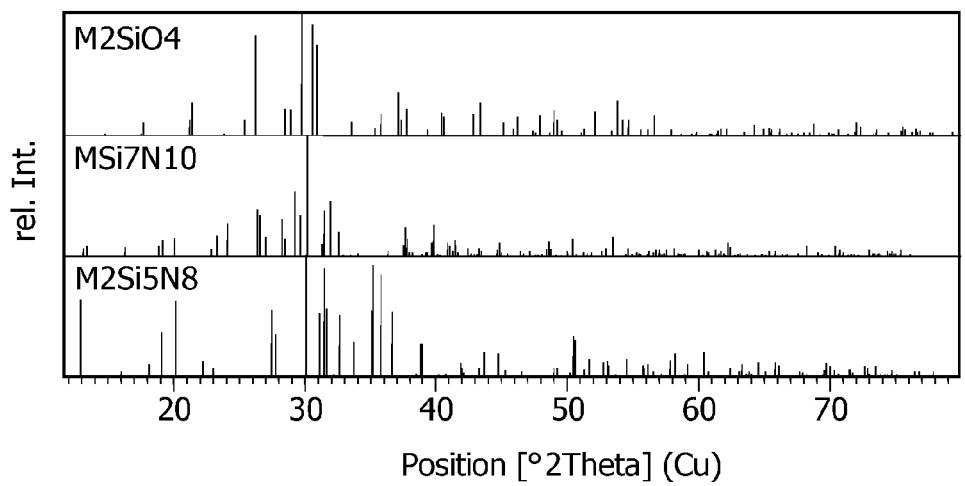
FIG. 2 shows three XRD patterns of the three main phases present in the material according to Example I

The XRD pattern of the material of Example I is shown in FIG. 1. FIG. 2 shows three XRD patterns of (from top to bottom): $M_2SiO_4$ (orthorhombic), $MSi_7N_{10}$ and $M_2Si_5N_8$ (orthorhombic).

From the superposition of FIGS. 1 and 2 it is apparent that the material according to Example I comprises orthorhombic $M_2Si_5N_8$ phase as main phase (>90%) and orthorhombic $M_2SiO_4$ and $MSi_7N_{10}$ as additional phases.

EXAMPLE II

Example II refers to $Ba_{1.404}Sr_{0.582}Eu_{0.014}Si_{4.936}N_{7.744}O_{0.256}$ This material was made analogous to the material of Example I, only that in step a) a powder with 0.7 at % Eu doping level (with respect to M-type atoms) was produced and in step c) ceramic processing, 90 wt % powder A is mixed with 10 wt % of powder B.

As a result dense composite ceramics with a relative density of 96.7% compared to the theoretical density of a phase pure $(Ba_{0.75}Sr_{0.25})_2Si_5N_8$ ceramic were obtained.

Figure 3:
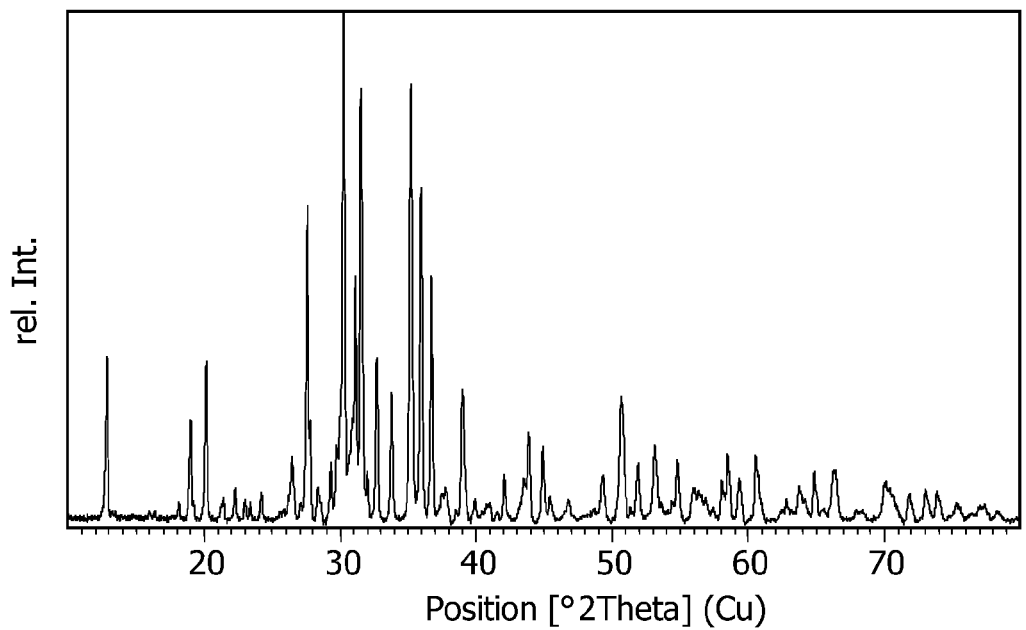
FIG. 3 shows an XRD pattern for a material according to Example II of the present invention
Figure 4:
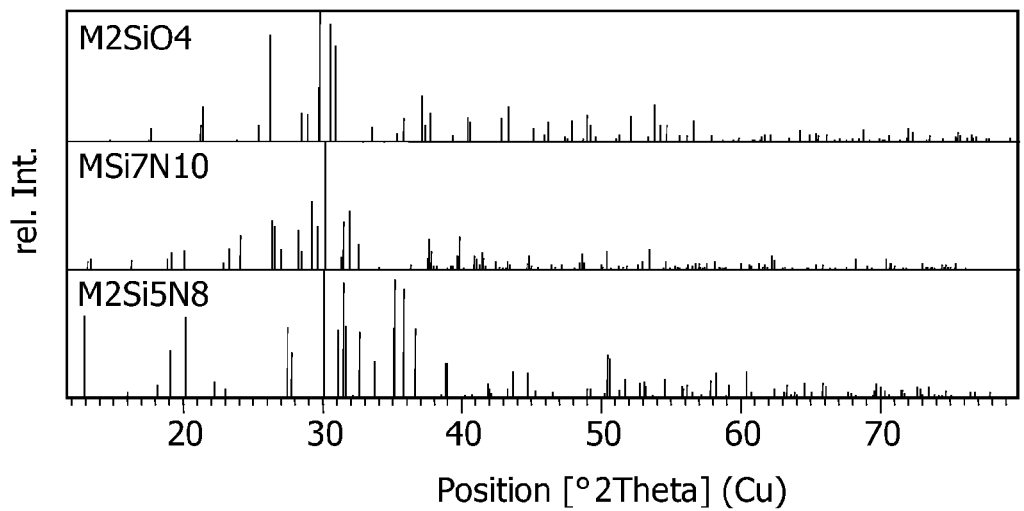
FIG. 4 shows three XRD patterns of the three main phases present in the material according to Example II

The XRD pattern of the material of Example I is shown in FIG. 3. FIG. 4 shows three XRD patterns of (from top to bottom): $M_2SiO_4$ (orthorhombic), $MSi_7N_{10}$ and $M_2Si_5N_8$ (orthorhombic).

From the superposition of FIGS. 3 and 4 it is apparent that the material according to Example I comprises orthorhombic $M_2Si_5N_8$ phase as main phase (>85%) and orthorhombic $M_2SiO_4$ and $MSi_7N_{10}$ as additional phases.

Figure 5:
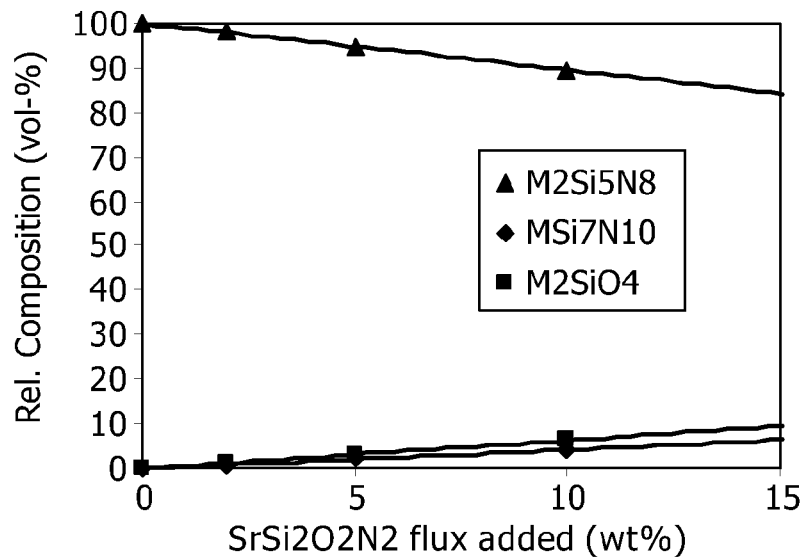
FIG. 5 shows a diagram of the relative content of the main phases in correlation with the amount of precursor material added prior to the production of the material

FIG. 5 shows a more generalized diagram, in which the correlation between the amount of $SrSi_2O_2N_2$ precursor material and the relative content of the three phases is shown as found in some examples of the present invention. Generally speaking, the content of the $M_2SiO_4$ and $MSi_7N_{10}$ increases with increasing addition of $SrSi_2O_2N_2$ precursor material, whereby usually the $M_2SiO_4$ phase is more prominent when the amount of $SrSi_2O_2N_2$ precursor material exceeds 5 wt % in the initial mixture.

Figure 6:
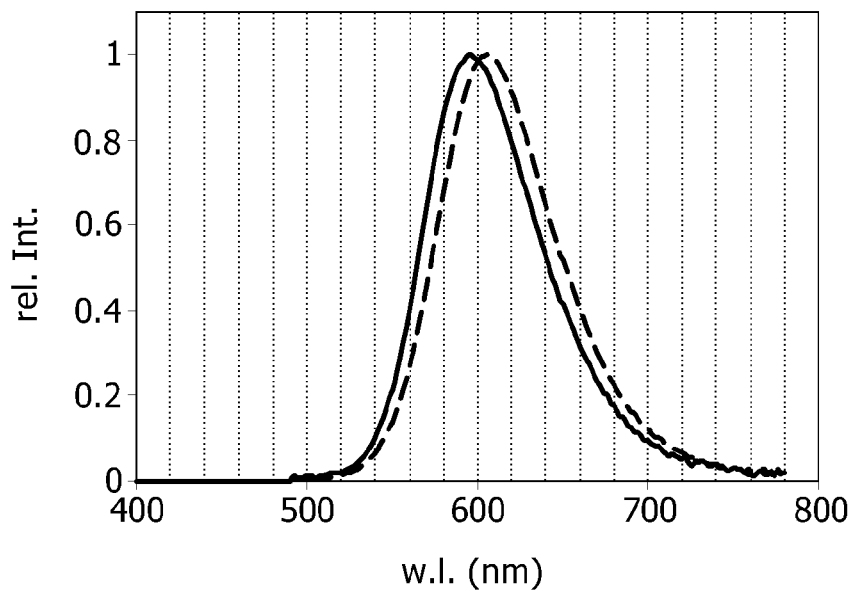
FIG. 6 shows two emission spectra of the materials of Example I and II, respectively.

FIG. 6 shows the emission spectra of the materials of Example I and II.

To this end, polished samples with a thickness of 200 μm of the ceramics of examples I and II were excited with a blue emitting LED light source with 450 nm emission. The ceramics show efficient emission in the amber spectral range. Example II (dotted line) shows a red shifted color point compared to example I because of the higher Sr and Eu concentration.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto. Furthermore, reference signs used in the description and claims do not limit the scope of the invention as claimed.

The invention claimed is:

1. Light emitting device comprising a light source, especially a LED, and a luminescent material which is a ceramic multiphase material essentially of the composition

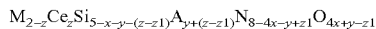

wherein:
M is selected out of the group comprising Sr, Ca, Ba, Mg, Eu or mixtures thereof,
A is selected out of the group comprising Al, B, Ga or mixtures thereof,
x is ≥0 to ≤0.5, y is ≥0 to ≤4, z is ≥0 to ≤1 and $z_1$ is ≥0 to ≤z,
the ceramic multiphase material comprises a main phase and an additional phase, wherein the main phase is crystallographically distinguishable from the additional phase and the main phase and the additional phase are present in the multiphase material as grains,
the main phase comprises one of $M_{2-z}Ce_zSi_{5-a-(z-z1)}A_{a+(z-z1)}N_{8-a+z1}O_{a-z1}$ and $Ba_bM^I{}_{2-b-z}Ce_zSi_{5-a-(z-z1)}A_{a+(z-z1)}N_{8-a+z1}O_{a-z1}$;
a is from ≥0 to ≤4, b is from ≥0 to ≤1, and $M^I$ is one of Sr, Ca, Mg, Eu, or mixtures thereof;
a volume content of the main phase in the material is ≤70%;
the additional phase comprises one of $M_2Si_7N_{10}$ and $M_2SiO_4$; and
a volume content of the additional phase is ≤15%.

2. The light emitting device of claim 1, whereby x is ≥0.0005 and ≤0.25.

3. The light emitting device of claim 1, whereby y+(z−z1) is ≥0.05 and ≤0.8.

4. The light emitting device of claim 1 whereby the Ba-content (in % of the number of "M"-atoms) is ≥30%.

5. The light emitting device of claim 1 whereby the Eu-content (in % of the number of "M"-atoms) is ≥0.02% and ≤5%.

6. A system comprising a light emitting device according to claim 1, the system being used in one or more of the following applications:
Office lighting systems
household application systems
shop lighting systems,
home lighting systems,
accent lighting systems,
spot lighting systems,
theater lighting systems,
fiber-optics application systems,
projection systems,
self-lit display systems,
pixelated display systems,
segmented display systems,
warning sign systems,
medical lighting application systems,
indicator sign systems, and
decorative lighting systems
portable systems
automotive applications
green house lighting systems.

7. Light emitting device comprising an LED and a luminescent material which is a ceramic multiphase material essentially of the composition

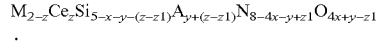

wherein:
M is selected out of the group comprising Sr, Ca, Ba, Mg, Eu or mixtures thereof,
A is selected out of the group comprising Al, B, Ga or mixtures thereof,
x is ≥0 to ≤0.5, y is ≥0 to ≤4, z is ≥0 to ≤1 and $z_1$ is ≥0 to ≤z, and
the added concentration (in mol % of the whole material) of Eu and Ce is ≤3%.

8. The light emitting device of claim 7, wherein x is ≥0.0005 and ≤0.25.

9. The light emitting device of claim 7, wherein y+(z−z1) is ≥0.05 and ≤0.8.

10. The light emitting device of claim 7 wherein the Ba-content (in % of the number of "M"-atoms) is ≥30%.

11. The light emitting device of claim 7 wherein the Eu-content (in % of the number of "M"-atoms) is ≥0.02% and ≤5%.

12. The light emitting device of claim 7 wherein the multiphase material comprises at least one phase of the composition $M_{2-z}Ce_zSi_{5-a-(z-z1)}A_{a+(z-z1)}N_{8-a+z1}O_{a-z1}$, with M, A, z and $z_1$ as defined above and a from ≥0 to ≤4.

13. The light emitting device of claim 7 wherein the multiphase material comprises at least one phase selected from the group of $MSi_7N_{10}$ and $M_2SiO_4$.

14. The light emitting device of claim 7, wherein:
the multiphase material comprises a main phase and an additional phase;

the main phase comprises one of $M_{2-z}Ce_zSi_{5-a-(z-z1)}A_{a+(z-z1)}N_{8-a+z1}O_{a-z1}$ and $Ba_bM^I_{2-b-z}Ce_zSi_{5-a-(z-z1)}A_{a+(z-z1)}N_{8-a+z1}O_{a-z1}$;

a is from $\geq 0$ to $\leq 4$, b is from $\geq 0$ to $\leq 1$, and $M^I$ is one of Sr, Ca, Mg, Eu, or mixtures thereof;

a volume content of the main phase in the material is $\geq 70\%$;

the additional phase comprises one of $M_2Si_7N_{10}$ and $M_2SiO_4$; and a volume content of the additional phase is $\leq 15\%$.

* * * * *